United States Patent
Tabei et al.

(10) Patent No.: US 12,431,859 B2
(45) Date of Patent: Sep. 30, 2025

(54) ACOUSTIC WAVE DEVICE

(71) Applicant: Murata Manufacturing Co., Ltd., Nagaokakyo (JP)

(72) Inventors: Toshiki Tabei, Nagaokakyo (JP); Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 162 days.

(21) Appl. No.: 18/522,334

(22) Filed: Nov. 29, 2023

(65) Prior Publication Data

US 2024/0097647 A1  Mar. 21, 2024

Related U.S. Application Data

(63) Continuation of application No. PCT/JP2022/020463, filed on May 17, 2022.

(30) Foreign Application Priority Data

Jun. 1, 2021 (JP) ................................ 2021-092408

(51) Int. Cl.
*H03H 9/05* (2006.01)
*H03H 9/10* (2006.01)
*H03H 9/72* (2006.01)

(52) U.S. Cl.
CPC .......... *H03H 9/059* (2013.01); *H03H 9/0576* (2013.01); *H03H 9/1085* (2013.01); *H03H 9/725* (2013.01)

(58) Field of Classification Search
CPC .... H03H 9/059; H03H 9/0576; H03H 9/1085; H03H 9/725; H03H 9/0523;
(Continued)

(56) References Cited

U.S. PATENT DOCUMENTS 11,817,846 B2 * 11/2023 Shin ...................... H01L 24/13
2004/0227236 A1 * 11/2004 Sawamoto ........ H01L 23/49822
257/734
(Continued)

FOREIGN PATENT DOCUMENTS

JP  2013093791 A  5/2013
JP  2014042330 A  3/2014
(Continued)

OTHER PUBLICATIONS

International Search Report in PCT/JP2022/020463, mailed Jul. 19, 2022, 3 pages.
(Continued)

*Primary Examiner* — Jorge L Salazar, Jr.
(74) *Attorney, Agent, or Firm* — Keating & Bennett, LLP

(57) ABSTRACT

An acoustic wave device includes a first acoustic wave chip and a second acoustic wave chip mounted on a substrate, first bumps bonding the first acoustic wave chip to the substrate and including first ground bumps connected to a ground potential, second bumps bonding the second acoustic wave chip to the substrate and including second ground bumps connected to a ground potential. When a number of the first ground bumps is n1, a number of the second ground bumps is n2, a height of the first ground bumps is h1, and a height of the second ground bumps is h2, n1<n2 and h1<h2.

12 Claims, 2 Drawing Sheets

(58) Field of Classification Search
CPC .. H03H 9/0547; H03H 9/0566; H03H 9/0542; H01L 25/04; H01L 25/18
USPC .................. 333/133, 186–188, 193–196
See application file for complete search history.

(56) References Cited

U.S. PATENT DOCUMENTS

| | | |
|---|---|---|
| 2004/0238954 A1* | 12/2004 | Miyaji .................. H01L 24/10 257/737 |
| 2016/0301386 A1 | 10/2016 | Iwamoto |
| 2019/0222194 A1 | 7/2019 | Nakagawa |

FOREIGN PATENT DOCUMENTS

| | | |
|---|---|---|
| JP | 2019125871 A | 7/2019 |
| WO | 2015098792 A1 | 7/2015 |
| WO | 2017110198 A1 | 6/2017 |

OTHER PUBLICATIONS

Written Opinion in PCT/JP2022/020463, mailed Jul. 19, 2022, 4 pages.

\* cited by examiner

ACOUSTIC WAVE DEVICE

CROSS REFERENCE TO RELATED APPLICATIONS

This application claims the benefit of priority to Japanese Patent Application No. 2021-092408 filed on Jun. 1, 2021 and is a Continuation Application of PCT Application No. PCT/JP2022/020463 filed on May 17, 2022. The entire contents of each application are hereby incorporated herein by reference.

BACKGROUND OF THE INVENTION

1. Field of the Invention

The present invention relates to an acoustic wave device in which a plurality of acoustic wave chips are mounted on a substrate.

2. Description of the Related Art

In the related art, an acoustic wave device in which a plurality of piezoelectric element chips are mounted on a substrate has been known. For example, Japanese Unexamined Patent Application Publication No. 2013-93791 discloses an acoustic wave device in which a plurality of acoustic wave elements are mounted on a substrate. Here, the acoustic wave chips are bonded to the substrate by bumps.

The bumps that bond the plurality of acoustic wave elements to the substrate are made equal in height.

In the acoustic wave device described in Japanese Unexamined Patent Application Publication No. 2013-93791, when the height of the bumps is increased, the attenuation characteristics sometime deteriorate depending on the acoustic wave element. On the other hand, when the height of the bumps is decreased, in a case where resin sealing is performed, the filling property of the resin between the acoustic wave chips and the substrate is sometimes poor.

SUMMARY OF THE INVENTION

Preferred embodiments of the present invention provide acoustic wave devices each with improved attenuation characteristics and resin filling properties of a sealing resin.

An acoustic wave device according to a preferred embodiment of the present invention includes a substrate including a first main surface and a second main surface facing each other, a first acoustic wave chip mounted on the first main surface of the substrate, a second acoustic wave chip mounted on the first main surface of the substrate, a plurality of first bumps bonding the substrate to the first acoustic wave chip, and a plurality of second bumps bonding the substrate to the second acoustic wave chip, and the plurality of first bumps include a plurality of first ground bumps connected to a ground potential, the plurality of second bumps include a plurality of second ground bumps connected to a ground potential, and when a number of the first ground bumps is n1, a number of the second ground bumps is n2, a height of the first ground bumps is h1, and a height of the second ground bumps is h2, n1<n2 and h1<h2.

According to preferred embodiments of the present invention, acoustic wave devices each with improved attenuation characteristics and resin filling properties of a sealing resin are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings to clarify the present invention.

The respective preferred embodiments described in the specification are exemplary, and partial replacement or combination of components between different preferred embodiments may be made.

Figure 1:
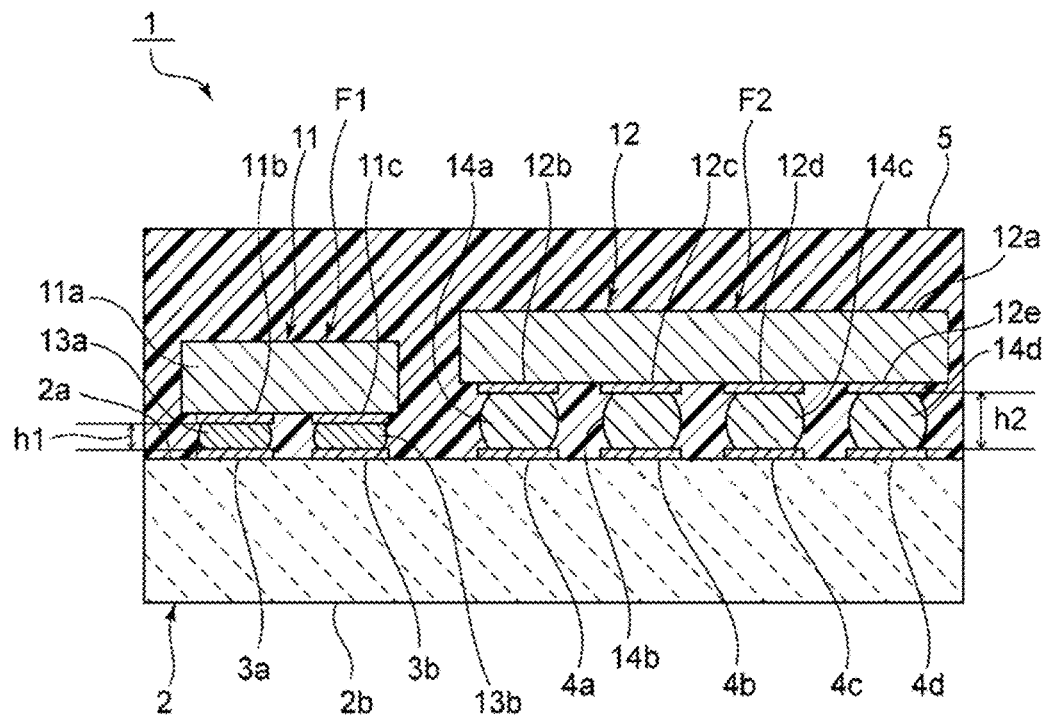
FIG. 1 is a front sectional view of an acoustic wave device according to a first preferred embodiment of the present invention.
Figure 2:
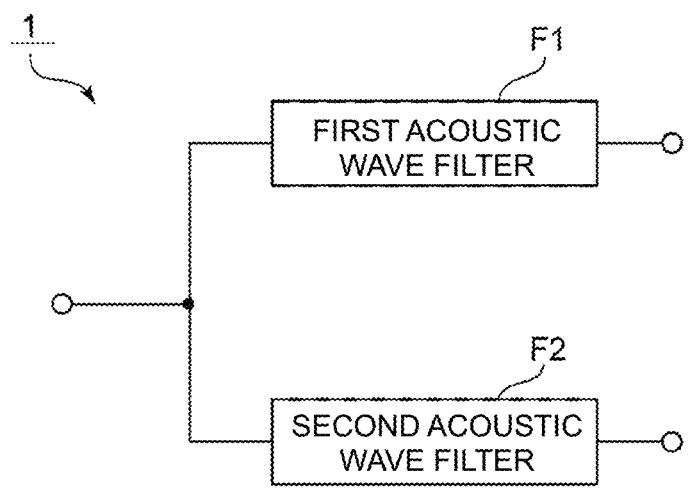
FIG. 2 is a diagram illustrating a circuit configuration of the acoustic wave device according to the first preferred embodiment of the present invention.

FIG. 1 is a front sectional view of an acoustic wave device according to a first preferred embodiment of the present invention. FIG. 2 is a diagram illustrating a circuit configuration of the acoustic wave device according to the first preferred embodiment.

As illustrated in FIG. 2, an acoustic wave device 1 includes a first acoustic wave filter F1 and a second acoustic wave filter F2. One end of the first acoustic wave filter F1 and one end of the second acoustic wave filter F2 are connected in common.

In FIG. 1, the first acoustic wave filter F1 and the second acoustic wave filter F2 are mounted on a substrate 2. The substrate 2 includes an upper surface 2a as a first main surface and a lower surface 2b as a second main surface. The first acoustic wave filter F1 includes a first acoustic wave chip 11. The first acoustic wave chip 11 includes a piezoelectric substrate 11a. The lower surface of the piezoelectric substrate 11a includes an electrode (not illustrated) defining an acoustic wave filter. In addition, the lower surface of the piezoelectric substrate 11a includes terminal electrodes 11b and 11c. The terminal electrodes 11b and 11c are connected to a ground potential. First ground bumps 13a and 13b are bonded to the terminal electrodes 11b and 11c. The first ground bumps 13a and 13b are bonded to electrode lands 3a and 3b provided on the upper surface 2a of the substrate 2. The electrode lands 3a and 3b are connected to a ground potential. The plurality of first bumps that bond the first acoustic wave chip 11 to the substrate 2 include the above-described first ground bumps 13a and 13b and a first hot-side bump that is not illustrated.

On the other hand, the second acoustic wave filter F2 includes a second acoustic wave chip 12. The second acoustic wave chip 12 includes a piezoelectric substrate 12a. In a non-illustrated portion of the piezoelectric substrate 12a, for example, an interdigital transducer (IDT) electrode and the like defining a filter is provided on the lower surface.

The lower surface of the piezoelectric substrate 12a includes terminal electrodes 12b, 12c, 12d, and 12e connected to a ground potential. The terminal electrodes 12b, 12c, 12d, and 12e are bonded to second ground bumps 14a, 14b, 14c, and 14d, respectively. The second ground bumps 14a to 14d are bonded to electrode lands 4a to 4d provided on the upper surface 2a of the substrate 2. The electrode lands 4a to 4d are connected to a ground potential. The plurality of second bumps that bond the second acoustic wave chip 12 to the substrate 2 include the above-described second ground bumps 14a to 14d and a second hot-side bump that is not illustrated.

In FIG. 1, among the terminal electrodes connected to the first and second acoustic wave chips 11 and 12, only the terminal electrodes 11b, 11c, 12b, 12c, 12d, and 12e connected to ground potentials are illustrated, but in a non-illustrated portion, a terminal electrode connected to a hot potential is provided. The terminal electrode connected to a hot potential is also bonded to a non-illustrated electrode land on the substrate 2 by using the first hot-side bump or the second hot-side bump included in the first or second bumps.

A sealing resin layer 5 covers the first acoustic wave chip 11 and the second acoustic wave chip 12.

A feature of the acoustic wave device 1 is that when the height of the first ground bumps 13a and 13b is h1 and the height of the second ground bumps 14a to 14d is h2, h1<h2, and the heights differ from each other. On the other hand, in the first acoustic wave chip 11, the number of the first ground bumps 13a and 13b is two, for example. In the second acoustic wave chip 12, the number of the second ground bumps 14a to 14d is four, for example. Therefore, when the number of the first ground bumps in the first acoustic wave chip 11 is n1, and the number of the second ground bumps in the second acoustic wave chip 12 is n2, n1<n2.

In addition, when the area of a surface of the first acoustic wave chip 11 on a side on which the first acoustic wave chip 11 is mounted on the substrate 2 is s1, and the area of a surface of the second acoustic wave chip 12 on a side on which the second acoustic wave chip 12 is mounted on the substrate 2 is s2, s1<s2.

In the acoustic wave device 1, as described above, when n1<n2, h1<h2, and thus even on the second acoustic wave chip 12 side where the number of ground bumps is large, the filling property of a resin of the sealing resin layer 5 is improved. In addition, on the first acoustic wave chip 11 side where the number of ground bumps is small, since the height h1 of the first ground bumps 13a and 13b is low, the attenuation characteristics can be improved. That is, since n1<n2 and h1<h2, both the attenuation characteristics and the resin filling property of the sealing resin can be improved. Furthermore, and in particular, in the acoustic wave device 1, s1<s2, and thus the filling property of the sealing resin can be more effectively improved.

Figure 3:
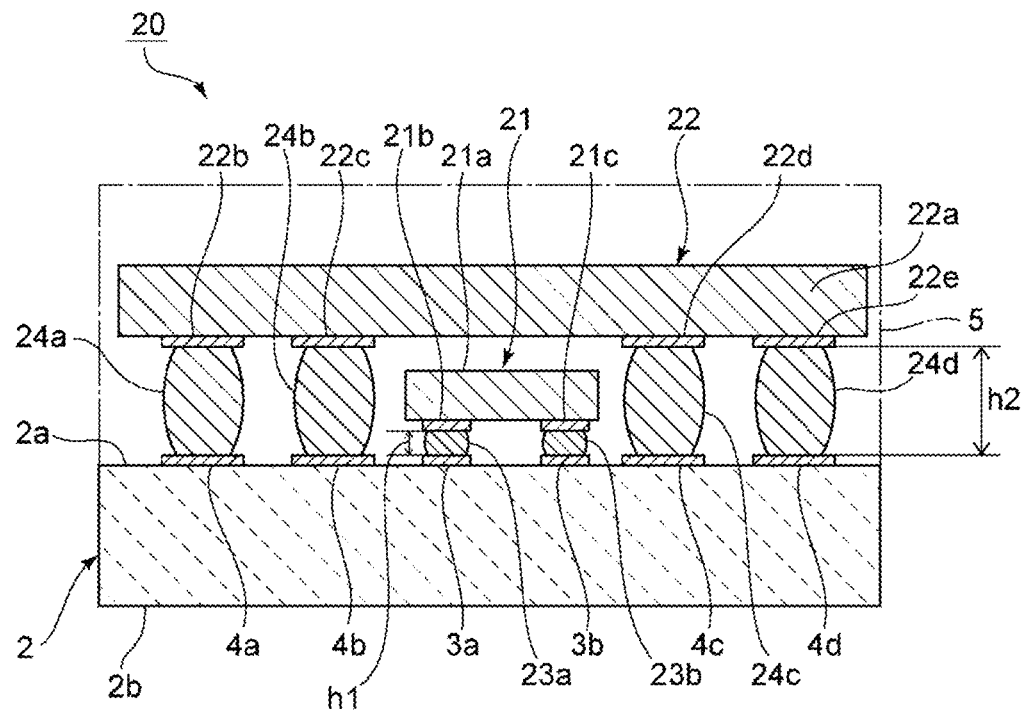
FIG. 3 is a front sectional view of an acoustic wave device according to a second preferred embodiment of the present invention.

FIG. 3 is a front sectional view of an acoustic wave device according to a second preferred embodiment of the present invention. In FIG. 3, for the sealing resin layer 5, only the location thereof is schematically illustrated with a one-dot chain line. In an acoustic wave device 20, a first acoustic wave chip 21 is mounted between the lower surface of a piezoelectric substrate 22a of a second acoustic wave chip 22 and the upper surface 2a of the substrate 2. That is, in a space between a second ground bump 24b and a second ground bump 24c, the first acoustic wave chip 21 is mounted. Therefore, the first acoustic wave chip 21 does not have to be disposed on a side of the second acoustic wave chip 22. Therefore, in the acoustic wave device 20, the planar area can be reduced. Since other configurations of the acoustic wave device 20 are the same or substantially the same as those of the acoustic wave device 1, the same or corresponding portions are denoted by reference numbers obtained by adding 10 to the reference numbers in FIG. 1, and description thereof will be omitted.

In the acoustic wave device 20 as well, n1<n2 and h1<h2, and furthermore, s1<s2. Therefore, both the attenuation characteristics and the filling property of the resin of the sealing resin can be improved.

Figure 4:
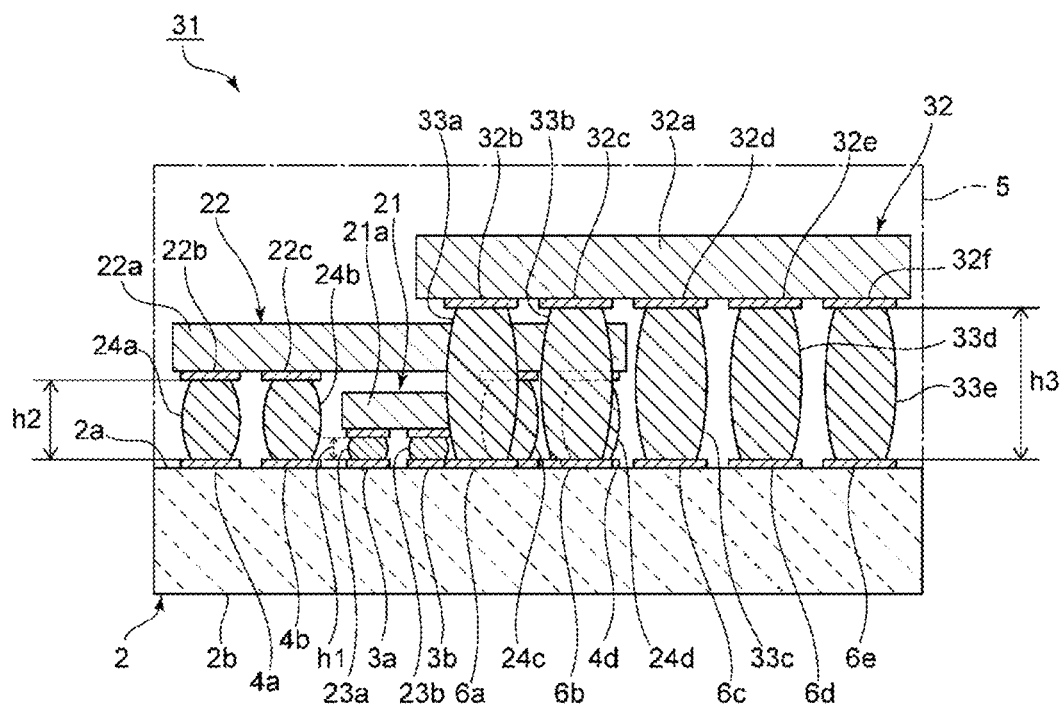
FIG. 4 is a front sectional view of an acoustic wave device according to a third preferred embodiment of the present invention.

FIG. 4 is a front sectional view of an acoustic wave device according to a third preferred embodiment of the present invention. In an acoustic wave device 31, similarly to the acoustic wave device 20 of the second preferred embodiment, the first acoustic wave chip 21 and the second acoustic wave chip 22 are mounted on the upper surface 2a of the substrate 2. Here, the first acoustic wave chip 21 is also mounted in a space between the second acoustic wave chip 22 and the upper surface 2a of the substrate 2.

Moreover, in the acoustic wave device 31, a third acoustic wave chip 32 is mounted on the upper surface 2a of the substrate 2. The third acoustic wave chip 32 includes a piezoelectric substrate 32a. The lower surface of the piezoelectric substrate 32a includes terminal electrodes 32b to 32f connected to a ground potential. Third ground bumps 33a to 33e are bonded to the terminal electrodes 32b to 32f. On the other hand, the third ground bumps 33a to 33e are bonded to electrode lands 6a to 6e provided on the upper surface 2a of the substrate 2. The electrode lands 6a to 6e are connected to a ground potential. The plurality of third bumps that bond the third acoustic wave chip 32 to the substrate 2 include the above-described third ground bumps 33a to 33e and a third hot-side bump that is not illustrated.

The third acoustic wave chip 32 defines an acoustic wave filter. Therefore, in the acoustic wave device 31, three acoustic wave filters are mounted on the substrate 2.

As described above, in the present preferred embodiment, in addition to the first and second acoustic wave chips, at least one third acoustic wave chip may also be mounted on the substrate.

In the third acoustic wave chip 32, the number of the third ground bumps 33a to 33e is n3, the height of the third ground bumps 33a to 33e is h3, and the area of a surface of the third acoustic wave chip 32 mounted on the substrate 2 is s3. In this case, n1<n2<n3, h1<h2<h3, and s1<s2<s3.

Therefore, in the acoustic wave device 31, also in the third acoustic wave chip 32 including the largest number of bumps, the filling property of the resin of the sealing resin layer 5 can be improved. In addition, the attenuation characteristics on the first acoustic wave chip 21 side and the second acoustic wave chip 22 side can also be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
   a substrate including a first main surface and a second main surface facing each other;
   a first acoustic wave chip mounted on the first main surface of the substrate;
   a second acoustic wave chip mounted on the first main surface of the substrate;
   a plurality of first bumps bonding the substrate to the first acoustic wave chip; and a plurality of second bumps bonding the substrate to the second acoustic wave chip; wherein the plurality of first bumps include a plurality of first ground bumps connected to a ground potential;

the plurality of second bumps include a plurality of second ground bumps connected to a ground potential; and when a number of the first ground bumps is n1, a number of the second ground bumps is n2, a height of the first ground bumps is h1, and a height of the second ground bumps is h2, n1<n2 and h1<h2.

2. The acoustic wave device according to claim 1, wherein when an area of a surface of the first acoustic wave chip on a side on which the first acoustic wave chip is mounted on the substrate is s1, and an area of a surface of the second acoustic wave chip on a side on which the second acoustic wave chip is mounted on the substrate is s2, s1<s2.

3. The acoustic wave device according to claim 1, wherein the first acoustic wave chip is mounted on the first main surface of the substrate between the first main surface of the substrate and the second acoustic wave chip.

4. The acoustic wave device according to claim 1, further comprising:

at least one third acoustic wave chip mounted on the substrate; wherein the third acoustic wave chip is bonded to the substrate by a plurality of third bumps;

the plurality of third bumps include a plurality of third ground bumps connected to a ground potential; and when a number of the plurality of third ground bumps is n3, and a height of the plurality of third ground bumps is h3, n1<n2<n3 and h1<h2<h3.

5. The acoustic wave device according to claim 1, further comprising a sealing resin layer covering the first and second acoustic wave chips.

6. The acoustic wave device according to claim 1, further comprising an acoustic wave filter.

7. The acoustic wave device according to claim 1, wherein the first acoustic wave chip includes a first piezoelectric substrate; and first terminal electrodes are provided on a lower surface of the first piezoelectric substrate and connected to a ground potential.

8. The acoustic wave device according to claim 7, wherein the first ground bumps are bonded to the first terminal electrodes.

9. The acoustic wave device according to claim 1, wherein first electrode lands are provided on the first main surface of the substrate; and the first ground bumps are bonded to the first electrode lands.

10. The acoustic wave device according to claim 1, wherein the second acoustic wave chip includes a second piezoelectric substrate; and second terminal electrodes are provided on a lower surface of the second piezoelectric substrate and connected to a ground potential.

11. The acoustic wave device according to claim 10, wherein the second ground bumps are bonded to the second terminal electrodes.

12. The acoustic wave device according to claim 1, wherein second electrode lands are provided on the first main surface of the substrate; and the second ground bumps are bonded to the second electrode lands.

* * * * *